(12) United States Patent  (10) Patent No.: US 12,604,481 B2
Gomes et al.  (45) Date of Patent: Apr. 14, 2026

(54) IC'S WITH MULTPLE LEVELS OF EMBEDDED MEMORY

(71) Applicant: Intel Corporation, Santa Clara, CA (US)

(72) Inventors: Wilfred Gomes, Portland, OR (US); Abhishek Anil Sharma, Portland, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 967 days.

(21) Appl. No.: 17/558,446

(22) Filed: Dec. 21, 2021

(65) Prior Publication Data

US 2023/0197654 A1    Jun. 22, 2023

(51) Int. Cl.
H01L 23/00 (2006.01)
H10B 53/30 (2023.01)
(Continued)

(52) U.S. Cl.
CPC .............. H01L 24/08 (2013.01); H01L 24/80 (2013.01); H10B 53/30 (2023.02); H10B 53/40 (2023.02);
(Continued)

(58) Field of Classification Search
CPC . H01L 2225/06527; H01L 2225/06544; H01L 2224/08146; H01L 2224/80895; H01L 23/00; H01L 24/08; H01L 24/80; H01L 25/065; H01L 25/0657; H01L 25/18; H10B 12/00; H10B 12/315; H10B 53/20; H10B 53/30; H10B 53/40; H10B 80/00;
(Continued)

(56) References Cited

U.S. PATENT DOCUMENTS 4,939,568 A    7/1990  Kato et al.
5,355,022 A    10/1994  Sugahara et al.
(Continued)

FOREIGN PATENT DOCUMENTS

CN    113540099    10/2021
JP    2002538465    11/2002
(Continued)

OTHER PUBLICATIONS

Extended European Search Report from European Patent Application No. 22201621.4 notified May 23, 2023, 9 pgs.
(Continued)

*Primary Examiner* — Brook Kebede
(74) *Attorney, Agent, or Firm* — Essential Patents Group, LLP

(57) ABSTRACT

Integrated circuits with embedded memory having multiple levels. Each memory array level includes ferroelectric capacitors coupled to an array of thin film access transistors according to a 1T-1F or 1T-many F bit-cell architecture. The levels of embedded memory are monolithically fabricated, one over the other, or after monolithically fabricating one level of embedded memory in a host IC structure, a second IC structure with another level of memory array is directly bonded to a front or backside of the host IC structure in a face-to-face or face-to-back orientation. The second IC structure may include additional peripheral CMOS circuitry, such as sense amps or decoders, or not.

14 Claims, 9 Drawing Sheets

(51) Int. Cl.
    *H10B 53/40*     (2023.01)
    *H10D 1/68*      (2025.01)
    *H10B 12/00*     (2023.01)

(52) U.S. Cl.
    CPC ... *H10D 1/682* (2025.01); *H01L 2224/08146*
        (2013.01); *H01L 2224/80895* (2013.01); *H10B*
        *12/315* (2023.02)

(58) Field of Classification Search
    CPC .......... H10D 1/68; H10D 1/682; H10D 86/40;
                    H10D 86/423; H10D 86/481; H10D
                    86/60
    See application file for complete search history.

(56)             References Cited

U.S. PATENT DOCUMENTS

| | | | |
|---|---|---|---|
| 5,869,867 | A | 2/1999 | Takeuchi |
| 6,424,020 | B1 | 7/2002 | Vu et al. |
| 6,455,398 | B1 | 9/2002 | Fonstad et al. |
| 6,605,951 | B1 | 8/2003 | Cowan |
| 6,627,953 | B1 | 9/2003 | Vu et al. |
| 7,091,534 | B2 | 8/2006 | Koyanagi |
| 7,095,068 | B2 | 8/2006 | Kumura et al. |
| 7,402,866 | B2 | 7/2008 | Liang et al. |
| 7,479,673 | B2 | 1/2009 | Jang et al. |
| 7,825,472 | B2 | 11/2010 | Park et al. |
| 7,947,540 | B2 | 5/2011 | Lee |
| 8,018,008 | B2 | 9/2011 | Ozoe |
| 8,084,795 | B2 | 12/2011 | Pan |
| 8,354,675 | B2 | 1/2013 | Kwon et al. |
| 8,395,191 | B2 | 3/2013 | Or-Bach et al. |
| 8,426,888 | B2 | 4/2013 | Molin |
| 9,012,292 | B2 | 4/2015 | Lee |
| 9,129,926 | B2 | 9/2015 | Koo et al. |
| 9,171,887 | B2 | 10/2015 | Yokoyama |
| 9,184,136 | B2 | 11/2015 | Kim et al. |
| 9,305,834 | B1 | 4/2016 | Latypov et al. |
| 9,385,195 | B1 | 7/2016 | Zhang |
| 9,412,788 | B2 | 8/2016 | Yokoyama et al. |
| 9,450,075 | B2 | 9/2016 | Huang |
| 9,627,476 | B2 | 4/2017 | Diaz et al. |
| 9,640,531 | B1 | 5/2017 | Or-Bach et al. |
| 9,786,783 | B2 | 10/2017 | Hafez et al. |
| 9,818,856 | B2 | 11/2017 | Hoshi et al. |
| 9,929,133 | B2 | 3/2018 | Lin et al. |
| 10,128,257 | B2 | 11/2018 | Pang et al. |
| 10,420,171 | B2 | 9/2019 | Goktepeli |
| 10,790,281 | B2 | 9/2020 | Mehandru et al. |
| 10,872,820 | B2 | 12/2020 | Block et al. |
| 11,569,250 | B2 | 1/2023 | Young et al. |
| 2001/0041407 | A1 | 11/2001 | Brown |
| 2002/0119640 | A1 | 8/2002 | Gonzalez |
| 2004/0119165 | A1 | 6/2004 | Baukus et al. |
| 2005/0151276 | A1 | 7/2005 | Jang et al. |
| 2005/0186787 | A1 | 8/2005 | Jung et al. |
| 2005/0275017 | A1 | 12/2005 | Pozder et al. |
| 2006/0115943 | A1 | 6/2006 | Koyanagi |
| 2006/0246709 | A1 | 11/2006 | Kim et al. |
| 2007/0001219 | A1 | 1/2007 | Radosavljevic et al. |
| 2007/0001232 | A1 | 1/2007 | King et al. |
| 2007/0181880 | A1 | 8/2007 | Kim |
| 2007/0249130 | A1 | 10/2007 | Anderson et al. |
| 2007/0296002 | A1 | 12/2007 | Liang et al. |
| 2008/0061285 | A1 | 3/2008 | Arghavani et al. |
| 2008/0179678 | A1 | 7/2008 | Dyer et al. |
| 2008/0185648 | A1 | 8/2008 | Jeong et al. |
| 2008/0217665 | A1 | 9/2008 | Chen et al. |
| 2009/0114955 | A1 | 5/2009 | Stapelmann et al. |
| 2009/0152611 | A1 | 6/2009 | Fujimoto |
| 2009/0166677 | A1 | 7/2009 | Shibata et al. |
| 2011/0095289 | A1 | 4/2011 | Sasaki et al. |
| 2011/0193240 | A1 | 8/2011 | Farooq et al. |
| 2011/0241073 | A1 | 10/2011 | Cohen et al. |
| 2012/0043663 | A1 | 2/2012 | Ko et al. |
| 2012/0088339 | A1 | 4/2012 | Molin et al. |
| 2012/0205727 | A1 | 8/2012 | Kanakasabapathy et al. |
| 2013/0126981 | A1 | 5/2013 | Ho et al. |
| 2013/0130479 | A1 | 5/2013 | Stuber et al. |
| 2013/0134585 | A1 | 5/2013 | Stuber et al. |
| 2013/0162346 | A1 | 6/2013 | McElvain et al. |
| 2013/0193583 | A1 | 8/2013 | Yi et al. |
| 2013/0241004 | A1 | 9/2013 | Yin et al. |
| 2013/0297981 | A1 | 11/2013 | Gu et al. |
| 2014/0054685 | A1 | 2/2014 | Consentino et al. |
| 2014/0210058 | A1 | 7/2014 | Lee et al. |
| 2014/0231874 | A1 | 8/2014 | Hoshi et al. |
| 2014/0264485 | A1 | 9/2014 | Li et al. |
| 2014/0264632 | A1 | 9/2014 | Richter et al. |
| 2014/0332749 | A1 | 11/2014 | Yokoyama |
| 2015/0028289 | A1 | 1/2015 | Hekmatshoartabari |
| 2015/0054033 | A1 | 2/2015 | Cheng et al. |
| 2015/0061020 | A1 | 3/2015 | Yokoyama et al. |
| 2015/0061026 | A1 | 3/2015 | Lin et al. |
| 2015/0069520 | A1 | 3/2015 | Lee |
| 2015/0129891 | A1 | 5/2015 | Lin et al. |
| 2015/0137224 | A1 | 5/2015 | Meiser et al. |
| 2015/0137842 | A1 | 5/2015 | Murakami et al. |
| 2015/0206936 | A1 | 7/2015 | Huang |
| 2015/0235949 | A1 | 8/2015 | Yu et al. |
| 2015/0280010 | A1 | 10/2015 | Shieh et al. |
| 2015/0318381 | A1 | 11/2015 | Tsai et al. |
| 2015/0347659 | A1 | 12/2015 | Chiang et al. |
| 2015/0348909 | A1 | 12/2015 | Yamazaki et al. |
| 2015/0348945 | A1 | 12/2015 | Or-Bach et al. |
| 2015/0348997 | A1 | 12/2015 | Sasagawa et al. |
| 2015/0357425 | A1 | 12/2015 | Liu et al. |
| 2015/0380305 | A1 | 12/2015 | Basker et al. |
| 2016/0043083 | A1 | 2/2016 | Kawa et al. |
| 2016/0093629 | A1 | 3/2016 | Wang |
| 2016/0095221 | A1 | 3/2016 | Ramachandran et al. |
| 2016/0197069 | A1 | 7/2016 | Morrow et al. |
| 2016/0247887 | A1 | 8/2016 | Jun et al. |
| 2016/0307996 | A1 | 10/2016 | Meiser et al. |
| 2016/0351492 | A1 | 12/2016 | Watanabe et al. |
| 2017/0345829 | A1 | 11/2017 | Balakrishnan et al. |
| 2018/0197895 | A1 | 7/2018 | Liu |
| 2019/0057959 | A1 | 2/2019 | Or-Bach et al. |
| 2019/0259699 | A1 | 8/2019 | Morrow et al. |
| 2020/0035560 | A1 | 1/2020 | Block et al. |
| 2020/0105774 | A1 | 4/2020 | Penumatcha et al. |
| 2020/0373301 | A1 | 11/2020 | Kim et al. |
| 2020/0411078 | A1* | 12/2020 | Sharma ............... H10B 12/315 |
| 2021/0111179 | A1* | 4/2021 | Shivaraman ........... H10B 53/10 |
| 2021/0336012 | A1 | 10/2021 | Huang et al. |
| 2021/0384191 | A1 | 12/2021 | Pillarisetty et al. |
| 2021/0391325 | A1 | 12/2021 | Su et al. |
| 2021/0408021 | A1* | 12/2021 | Young ................... H10B 53/40 |
| 2024/0194533 | A1 | 6/2024 | Rao et al. |

FOREIGN PATENT DOCUMENTS

| | | |
|---|---|---|
| JP | 2008529012 | 7/2008 |
| JP | 2009135350 A | 6/2009 |
| JP | 2010171166 A | 8/2010 |
| JP | 2012088065 | 5/2012 |
| JP | 2012195539 | 10/2012 |
| JP | 2013120887 | 6/2013 |
| KR | 1020100106702 | 10/2010 |
| TW | 200624818 | 7/2006 |
| WO | 2011058611 A1 | 5/2011 |
| WO | 2013004836 | 1/2013 |
| WO | 2013166116 | 11/2013 |
| WO | 2017052562 | 3/2017 |
| WO | 2017052626 | 3/2017 |
| WO | 2018031175 | 2/2018 |
| WO | 2018063302 | 4/2018 |

OTHER PUBLICATIONS

Final Office Action from U.S. Appl. No. 17/112,697 notified Mar. 30, 2023, 10 pgs.

(56) References Cited

OTHER PUBLICATIONS

Kang, Chang Yong., et al., "Effects of Film Stress Modulation Using TiN Metal Gate on Stress Engineering and Its Impact on Device Characteristics in Metal Gate/High-k Dielectric SOI FinFETs," IEEE Electron Device Letters, vol. 29, No. 5, May 2008, 4pgs.

Non-Final Office Action from U.S. Appl. No. 16/316,330 notified Mar. 9, 2020, 9 pgs.

Non-Final Office Action from U.S. Appl. No. 17/112,697 notified Sep. 29, 2022, 8 pgs.

Notice of Allowance from U.S. Appl. No. 16/316,330 notified Aug. 26, 2020, 9 pgs.

Notice of Allowance from U.S. Appl. No. 17/112,697 notified Aug. 11, 2023, 7 pgs.

Restriction Requirement from U.S. Appl. No. 17/112,697 notified Apr. 22, 2022, 7 pgs.

Restriction Requirement from U.S. Appl. No. 18/389,625 notified May 30, 2025, 9 pgs.

Restriction Requirement mailed Nov. 26, 19 for U.S. Appl. No. 16/316,330.

* cited by examiner

BATTERY
915

905

906

IC WITH MULTIPLE
LEVELS OF eDRAM
950

INTEGRATED
SYSTEM
910 eDRAM 930

MULTIPLE TFT/
RCAT LEVELS
931

MULTIPLE FE
CAP LEVELS
932

FEOL PERIPHERAL
CIRCUITRY 920

960

FEOL PROCESSOR
CIRCUITRY
940

910

IC'S WITH MULTPLE LEVELS OF EMBEDDED MEMORY

BACKGROUND

Embedded memory is monolithically integrated into host integrated circuitry (i.e., both memory and the host circuitry fabricated on the same die or chip). One embedded memory architecture is DRAM based on a 1T-1C cell that includes a "write," "select" or "access" transistor and a storage capacitor. An array of such bit-cells may be integrated with host logic circuitry, such as a host microprocessor chip (e.g., a central processing unit or "CPU" core). Integration of both a capacitor memory device and a processor proximate to one another in a same IC chip, for example, enables communication between the memory device and the processor through a chip bus capable of higher bandwidths and/or lower signal latencies relative to packaged IC chips communicating through package interconnects.

A transistor and a capacitor of each 1T-1C cell may be electrically coupled through one or more metal interconnect layers formed in the back-end-of-line (BEOL) over logic circuitry formed in the front-end-of-line (FEOL). The BEOL is the portion of IC fabrication where individual semiconductor devices (whether embedded memory or logic transistors) are interconnected to one another with metal interconnect traces (lines) within a given metallization level and metal vias between multiple metallization levels. These conductive interconnects are embedded in a dielectric material so that the memory device is a monolithic integrated circuit.

In conventional embedded DRAM (eDRAM), each capacitor comprises an insulative dielectric material separating charge stored on capacitor conductors. An embedded memory architecture may rely on the application of a voltage to one capacitor conductor with the other conductor held at some reference (e.g., ground). In a ferroelectric embedded DRAM (FeDRAM), each capacitor comprises a ferroelectric material. An embedded memory architecture may then rely on polarization states of a capacitor's ferroelectric material, which can be changed when an electric field applied across the capacitor conductors is of correct polarity and sufficient strength to alter the semi-permanent dipoles within the ferroelectric material. A given polarization state may be sensed by measuring an amount of charge needed to flip the ferroelectric capacitor to an opposite polarity state. The read cell may then be subsequently rewritten to the previous polarization state to retain the ascertained bit value.

Embedded DRAM and embedded FeDRAM architectures, and the fabrication techniques associated with those architectures, that increase the on-chip bit-cell count are commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
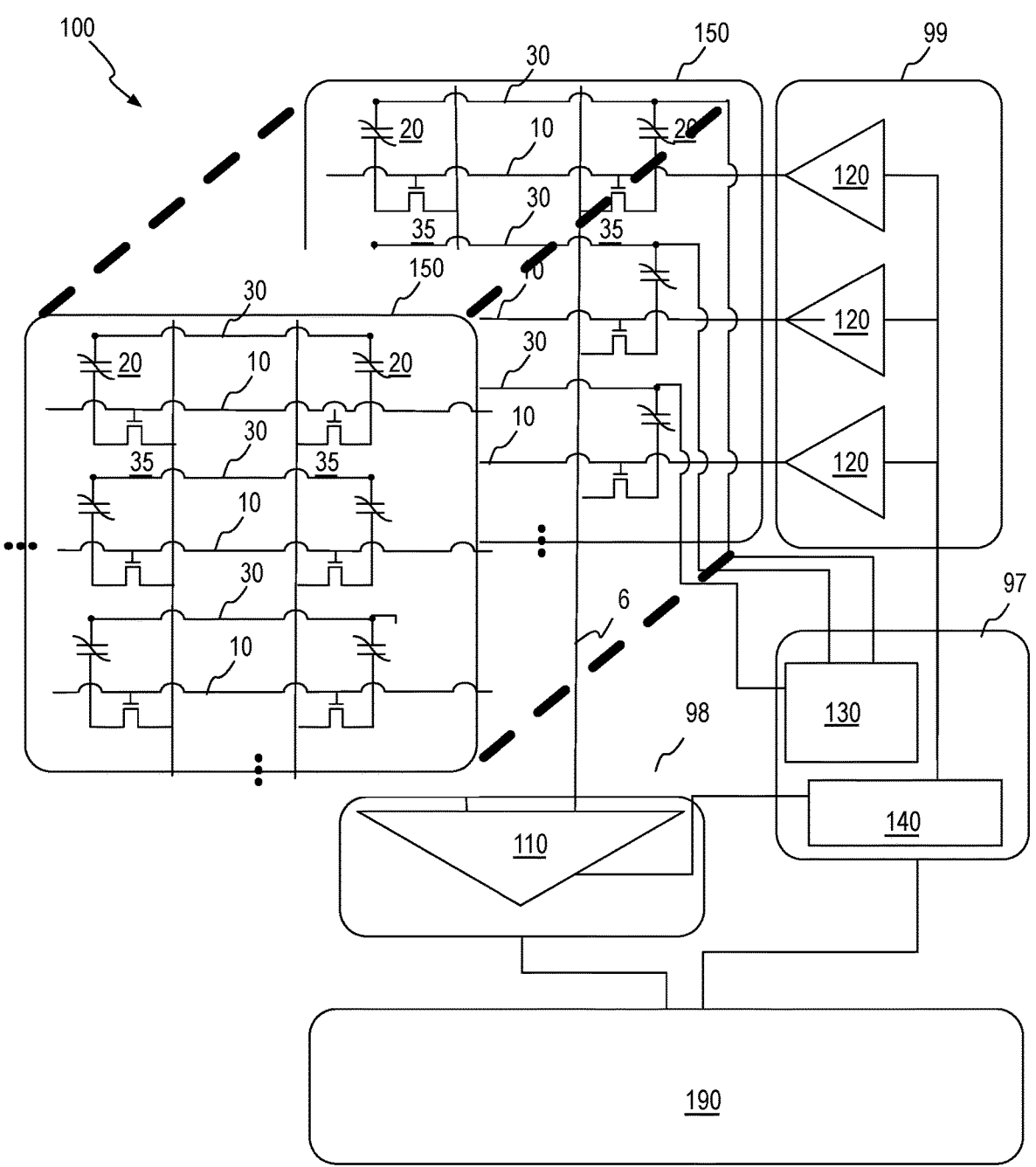
FIG. 1 illustrates a schematic of an integrated circuit (IC) with multiple levels of embedded 1T-1F memory array structures, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

Integrated circuits with embedded memory having multiple levels are described herein. Each memory array level may include ferroelectric capacitors coupled to an array of thin film access transistors according to a 1T-1F or 1T-many F bit-cell architecture. The levels of embedded memory may be monolithically fabricated, one over the other in succession. Alternative one level of embedded memory is monolithically fabricated in a host IC structure, and a second IC structure with another level of memory array is directly bonded to a front or backside of the host IC structure in a face-to-face or face-to-back orientation to form a composite IC structure that includes the multiple memory array levels. The second IC structure may include additional peripheral CMOS circuitry, such as sense amps or decoders, or peripheral CMOS circuitry of the host IC structure is interconnected with the second memory array level through a bond interface.

FIG. 1 is a schematic illustrating an IC 100 with multiple levels embedded memory, in accordance with some embodiments. In this macro-view, each of two memory array levels 150 includes a 2D array of storage capacitors 20 networked with conductive traces including multiple bitlines 6, wordlines 10, and second capacitor plate lines 30. Each memory array level 150 further includes a select/access transistor 35 electrically coupled to each storage capacitor 20. At least one of memory array levels 150 is fabricated in the BEOL interconnect levels of IC 100. Hence, for at least one of memory array levels 150 all of capacitors 20, bitlines 6, wordlines 10, select transistors 35 and plate lines 30 are fabricated within, and/or between, various interconnect metallization levels. In accordance with some embodiments, a second one of memory array levels 150 is also monolithically fabricated in the BEOL interconnect levels of IC 100, for example with substantially the same fabrication processes and process sequences employed to form the first of memory array levels 150. Noting that with additional IC levels, fabrication processes (e.g., planarization) becomes more difficult, in accordance with some alternative embodiments, a second one of memory array levels 150 is directly bonded to a host IC comprising a first one of memory levels 150. With the direct bonding, IC 100 is referred to herein as a "composite" IC to be distinguished from both a monolithic IC and a multi-chip stack joined through first level interconnects (typically comprising solder) characteristic of IC package technology.

As further illustrated in FIG. 1, peripheral memory circuitry including at least one of column decoder circuitry 98 and row decoder circuitry 99 may be located within a transistor device level that falls within at least some of the footprint of memory array levels 150. For example, bitlines 6 may be electrically coupled to a sense amplifier 110 implemented with CMOS circuitry fabricated in a region of a monocrystalline semiconductor device layer (e.g., silicon substrate) that is at least partially underlying one or more of the memory array level 150. In further embodiments, word-lines 10 are electrically coupled to wordline drivers 120, which may also be implemented with CMOS circuitry fabricated in a region of a monocrystalline semiconductor device layer (e.g., silicon substrate) that is at least partially underlying one or more of the memory array levels 150.

Peripheral memory circuitry further includes control circuitry 97. One or more of column circuitry 98, and/or row circuitry 99, and/or memory array levels 150 may be electrically coupled to control circuitry 97. Control circuitry 97 may include, for example, various voltage biasing circuits, such as capacitor bias circuitry 130 that includes a charge pump that can be independently coupled to individual ones of a plurality of top capacitor plate lines 30. Hence, in addition to being able to charge up one capacitor plate through application of a voltage to bitlines, plate lines 30 may also charge up the second capacitor plates coupled to a given one of capacitor plate lines 30. Hence, rather than one plate of the storage capacitors being tied together across many wordlines and many bitlines, for example by a continuous sheet of capacitor conductor, the second capacitor conductors are separated into subset populations with each subset of capacitors being associated with either one bitline or with one wordline. In the example illustrated in FIG. 1, plate lines 30 run parallel to wordlines 10 so that a plate of each capacitor 20 coupled to one wordline 10 is tied to one plate line 30. In alternative embodiments, plate lines 30 may instead run parallel to bitlines 6 so that a plate of each capacitor 20 coupled to one bitline 6 is tied to one plate line 30. Regardless of the plate line configuration, the subset of capacitors that are electrically coupled by one capacitor plate line 30 may be coupled to a charge pump independent of the other plate lines.

Control circuitry 97 may also include, for example, various memory management circuitry, such as control logic 140 communicatively coupled into column circuitry 98 and row circuitry 99 so as to permit coordinated operation of sense amplifier 110 and wordline driver 120. Control circuitry 97 may also be fabricated in a device level the falls within the footprint of memory array levels 150. Control circuitry 97 may, for example, also employ MOSFETs fabricated in a region of a monocrystalline semiconductor device layer (e.g., silicon substrate) that is at least partially underlying one or more of memory array levels 150.

IC 100 further includes host logic circuitry 190. Host logic circuitry 190 is a primary consumer of memory bandwidth supplied by memory array levels 150. Host logic circuitry 190 may be any application specific IC (ASIC) including one or more IP cores. In some embodiments, host logic circuitry 190 comprises a processor core. In other embodiments, host logic circuitry 190 comprises any of a wireless radio circuit, or floating point gate array (FPGA).

In some embodiments, all of the periphery memory circuitry for the various number of memory array levels 150 is implemented in a region of a single monocrystalline semiconductor device layer (e.g., silicon substrate). For some further embodiments where the second memory level array 150 is bonded to a host IC structure including the periphery memory circuitry, some of the periphery memory circuitry of the host IC is coupled to the second memory level array 150 through bonded interconnect features. In alternative embodiments, a second IC structure that includes a second memory array level 150 further includes another single monocrystalline semiconductor device layer implementing periphery memory circuitry for the second memory array level 150. Hence, for these embodiments, a host IC structure that includes periphery memory circuitry may be directly bonded to a second IC structure that further includes additional periphery memory circuitry which is similarly interconnected to the second memory array level 150.

In exemplary embodiments, memory array levels 150 comprises a 2D array of metal-ferroelectric-metal (MFM) capacitors 20 fabricated in a vertical stack with a corresponding array of the access transistors 35. In some exemplary embodiments, the individual memory cells/bit-cells include one access transistor 35 and one ferroelectric capacitor 20 (1T-1F). In other exemplary embodiments, the individual memory cells/bit-cells include one access transistor 35 and many (e.g., x) ferroelectric capacitors 20 (1T-xF). The 1T-xF architectures rely on the fact presence of many dipolar domains within a ferroelectric film, and so a 1T-1F structure may be modified to enable the writing and sensing of separate domains within the ferroelectric film. Some exemplary embodiments of each of 1T-1F and 1T-xF architectures are described further below.

FE-capacitors 20 may occupy a footprint over a substrate including logic circuitry including field effect transistors (FETs), for example implementing the peripheral circuitry as described above. CMOS FET circuitry implementing host logic circuitry 190 may be adjacent to the footprint of memory array levels 150. Access transistors 35 providing wordline and bitline access to the FE-capacitors may reside within the BEOL substantially within the footprint of the FE-capacitor array.

For some exemplary embodiments, access transistor 35 of a 1T-1F storage cell is a thin-film transistor (TFT) rather than a monocrystalline silicon-based transistor (e.g., MOS-FET). TFTs are a class of field-effect transistors (FETs) in which the channel material is a deposited thin film rather than a monocrystalline material. The thin film deposition processes employed in TFT fabrication can be relatively low temperature (e.g., below 450° C.), allowing TFTs to be inserted within layers of interconnect metallization of the type that is typically formed only after higher-temperature processing is completed in conventional silicon MOSFET fabrication technology. TFTs can be made using a wide variety of semiconductor materials, such as silicon, germanium, silicon-germanium, as well as various oxide semiconductors (a.k.a. semiconducting oxides) including metal oxides like indium gallium zinc oxide (IGZO), indium zinc oxide (IZO), and the like.

The access transistor 35 of a 1T-1F storage cell may also be a recessed channel array transistor (RCAT). RCATs are a class of field-effect transistors (FETs) in which the gate is recessed into the channel material. Recession into the channel increases the effective channel length of the transistor without increasing the transistor footprint, allowing access transistor 35 to have an area matched to that of an overlying ferroelectric capacitor 20.

Figure 2:
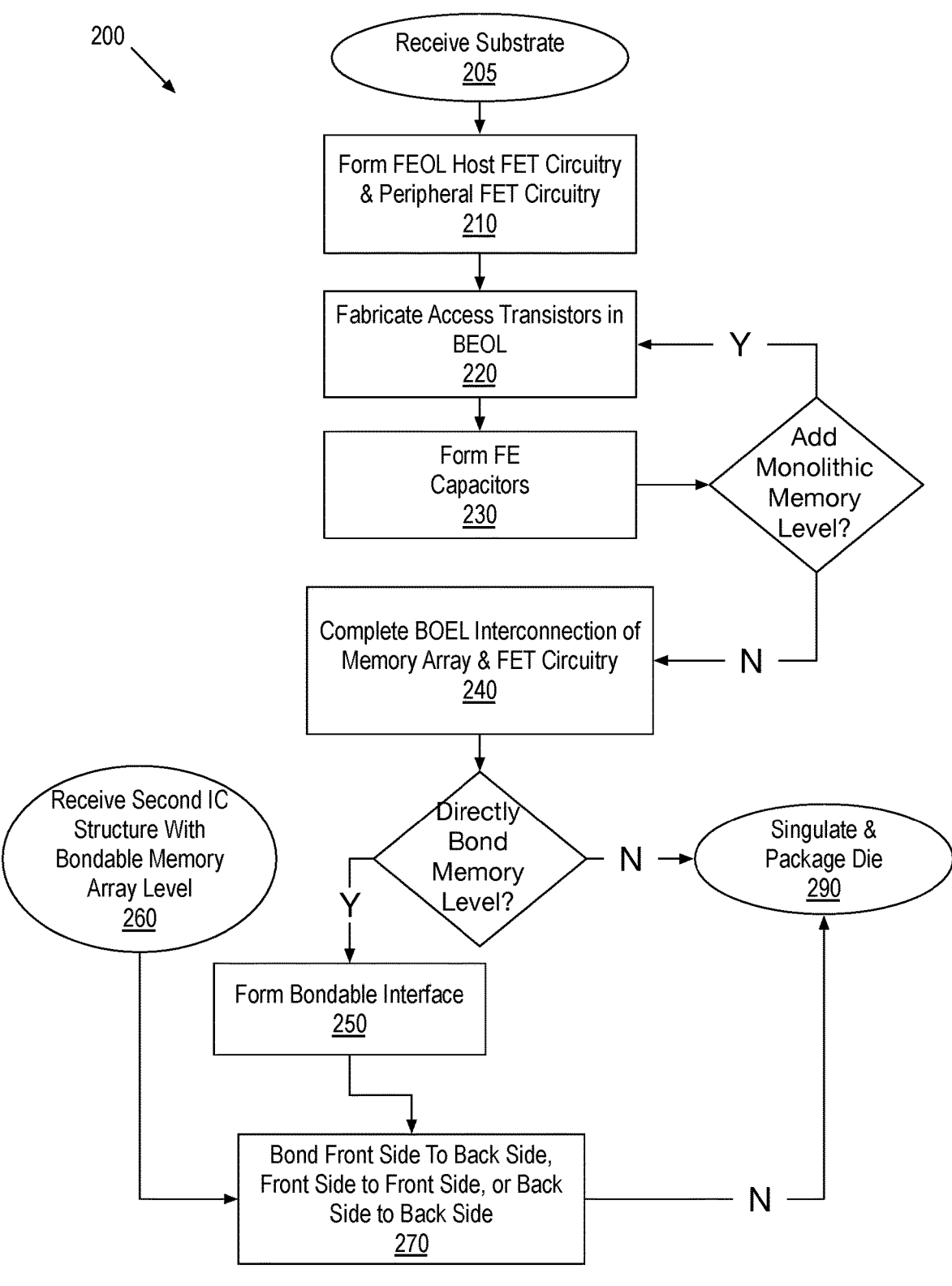
FIG. 2 is a flow diagram illustrating methods of fabricating an IC with multiple levels of embedded memory array structures, in accordance with some embodiments.
Figure 3:
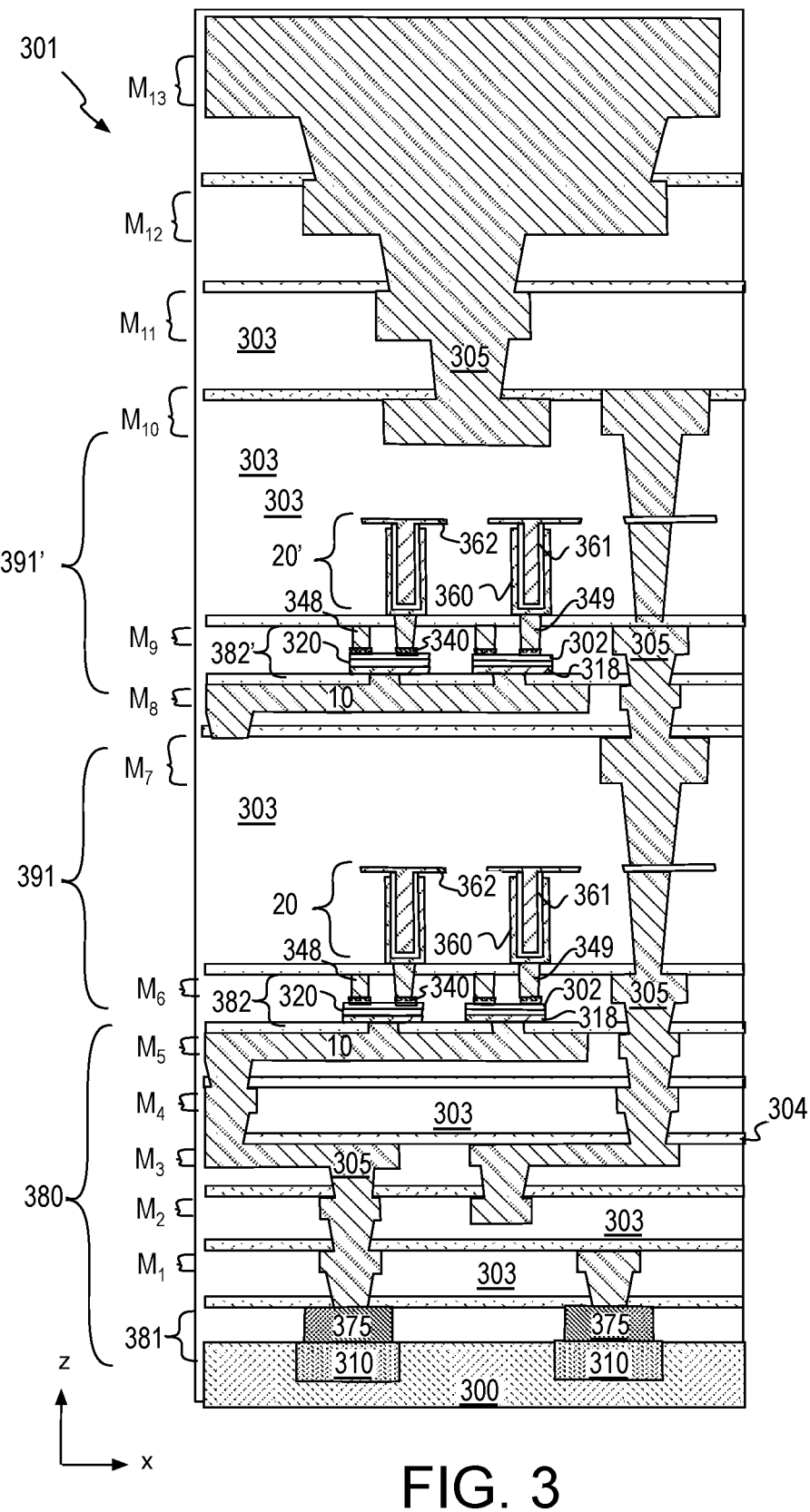
FIG. 3 illustrates a cross-sectional side view of the IC illustrated in FIG. 1, in accordance with some exemplary monolithic embodiments.

FIG. 2 is a flow diagram illustrating methods 200 for fabricating IC 100 (FIG. 1), in accordance with some embodiments. FIG. 3 illustrates a cross-sectional side view of an IC structure 301 that may be fabricated according to some embodiments methods 200. IC structure 301 is an exemplary implementation of IC 100 in accordance with some embodiments of monolithic multi-level memory arrays.

As shown in FIG. 2, methods 200 begin at input 205 where an input substrate is received. FIG. 3 illustrates an example where the input substrate 300 comprises a monocrystalline semiconductor material such as, but not limited to, predominantly silicon (e.g., substantially pure Si) material, predominantly germanium (e.g., substantially pure Ge) material, or a compound material comprising a Group IV majority constituent (e.g., SiGe alloys, GeSn alloys). In other embodiments, substrate 300 is a Group III-N material comprising a Group III majority constituent and nitrogen as a majority constituent (e.g., GaN, InGaN). Other embodiments are also possible, for example where substrate 300 is a Group III-V material comprising a Group III majority constituent and a Group IV majority constituent (e.g., InGaAs, GaAs, GaSb, InGaSb).

Returning to FIG. 2, methods 200 continue at block 210 where FEOL fabrication processes are practiced to form host (e.g., ASIC) logic circuitry and embedded memory peripheral FET circuitry. Any FEOL process(es) may be practiced at block 210. In the example illustrated in FIGS. 3A and 3B, FEOL circuitry 380 includes peripheral logic circuitry of an embedded memory that includes field effect transistors (FETs) 381. CMOS FET circuitry implementing host integrated circuitry (not depicted) may be anywhere laterally adjacent to the peripheral logic circuitry of the embedded memory, but within the same plane as FETs 381.

FETs 381 employ monocrystalline semiconductor material for at least the channel semiconductor (not visible as out of the plane of FIG. 3). FETs 381 further include a gate terminal (not visible as out of the plane of FIG. 3) separated from channel semiconductor by a gate insulator (not visible as out of the plane of FIG. 3). Channel semiconductor separates semiconductor terminals (source semiconductor and drain semiconductor). Contact metallization 375 lands on the semiconductor source/drain material 310 and is separated from the gate terminal by an intervening insulator. FETs 381 may be planar or non-planar devices. In some advantageous embodiments, FETS 381 are finFETs.

FEOL circuitry 380 further includes one or more initial levels of interconnect metallization 305 embedded in dielectric materials 303 and 304. In the exemplary embodiment illustrated, FEOL circuitry 380 includes metal-one ($M_1$), metal-two ($M_2$) metal-three ($M_3$), and metal-four ($M_4$) levels interconnecting FETs 381. In the example, metal-five implements a wordline 10.

Returning to FIG. 2, methods 200 continue at block 220 where access transistors are fabricated over the FEOL circuitry, within a BEOL layer. In some embodiments, block 220 comprises fabricating TFTs. The TFTs may be planar channel devices, fin channel devices, or recessed channel devices. In the example illustrated in FIG. 3, a plurality of TFTs 382 is located over FEOL circuitry 380. As shown, all TFTs 382 employ portions of thin film semiconductor layer 302, which is an amorphous or polycrystalline film that may extend across, and/or between, all TFTs 382, or comprise a plurality of physically separated islands. Individual ones of TFTs 382 include a gate terminal (electrode) 318 separated from semiconductor layer 302 by a gate insulator 320. In the exemplary embodiment illustrated, TFTs 382 are "bottom-gate" devices with semiconductor layer 302 deposited over gate terminal 318. Alternatively, top-gate architectures are also possible where at least gate terminal 318 is above semiconductor layer 302. Terminal contact metallization 340 lands on source and drain regions of semiconductor layer 302.

Semiconductor layer 302 may be a group IV semiconductor material, such as silicon (Si), germanium (Ge), and SiGe alloys. However, in some exemplary embodiments, semiconductor layer 302 comprises an oxide semiconductor, or semiconducting oxide, or a semiconductor, comprising a metal and oxygen. Many metal oxide semiconductor materials have a wide band gap oxide channel material offering low leakage. With essentially no minority carriers, majority-minority carrier recombination cannot generate significant off-state leakage current. Through low-leakage, TFTs 382 may enable higher retention rates at higher memory density and enhance the performance of a 1T-1F cell further including a ferroelectric capacitor.

An oxide semiconductor thin film can be amorphous (i.e., having no structural order), or polycrystalline (e.g., having micro-scale to nano-scale crystal grains). Exemplary metal oxides include a transition metal (e.g., IUPAC group 4-10) or post-transition metal (e.g., IUPAC groups 11-15). In advantageous embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof.

Semiconductor layer 302 may be a p-type, n-type, or intrinsic material. In exemplary embodiments, semiconductor layer 302 is n-type as many oxide semiconductors have been found to be capable of significant electron densities. In some embodiments, semiconductor layer 302 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some other embodiments, semiconductor layer 302 comprises a zinc oxide ($ZnO_x$), such as Zn(II) oxide, or ZnO. In other embodiments, the zinc oxide is zinc dioxide ($ZnO_2$) or a mixture of ZnO and $ZnO_2$, where x may range between 1 and 2. In some other embodiments, semiconductor layer 302 comprises titanium oxide ($TiO_x$), or $SnO_x$.

Semiconductor layer 302 or various portions thereof, may be intentionally doped, or not. Compared to intrinsic oxide semiconductor that is not intentionally doped, n-type and p-type oxide semiconductors may have a higher concentration of impurities, such as, but not limited to, one or more group III element, group V element, and/or elemental hydrogen (H), and/or oxygen vacancies. In some embodiments where semiconductor layer 302 comprises $ZnO_x$, the dopants may include In and Ga. In some specific examples, semiconductor layer 302 is $InGaO_3(ZnO)_5$, often referred to simply as IGZO.

Access transistors are coupled to a memory device bitline comprising an interconnect metallization trace within a BEOL metallization level $M_6$, above TFTs 382. Memory device bitline may alternatively comprise an interconnect metallization within a metallization level $M_5$, below TFTs 382. As further shown in FIG. 3, metal line 348 provides a bitline connection to contact metallization 340 landing on semiconductor terminals (e.g., drain semiconductor) of access transistors. Source terminals of access transistors are electrically connected to capacitor storage node through interconnect metallization 349. Storage node interconnect metallization 349 is adjacent to, but electrically insulated from, the bitline, and in this example includes a $M_6$ line and an overlying via.

Returning to FIG. 2, methods 200 continue at block 230 where FE capacitors are formed within a BEOL level over the access transistors. At block 230, ferroelectric material is formed on at least one sidewall of a capacitor conductor. As shown in FIG. 3, each storage node interconnect metallization 349 electrically couples a first conductive capacitor plate conductor 360 to a semiconductor terminal (e.g., source semiconductor) of one access transistor. FE capacitors 20 further include another plate conductor 362 that is separated from conductor 360 by an intervening ferroelectric material 361. Conductor material 362 may be continuous across FE capacitors 20 associated with multiple bitlines, but a single wordline, for example. Although conductors 360 and 362 may have any composition known to be suitable for a storage capacitor, in exemplary embodiments, the compositions are ones that can be deposited by ALD for the sake of high conformality. In some embodiments, conductors 360 and 362 are both of the same metal or metallic compound, with some examples being Ti, $TiN_x$.

Ferroelectric material 361 advantageously has a higher relative permittivity than high-K dielectric materials that lack the spontaneous polarization of materials in a ferroelectric phase (orthorhombic, non-centrosymmetric crystallinity). For example, a high-k dielectric comprising predominantly hafnium and oxygen ($HfO_x$), but not in a ferroelectric phase, may have a relative permittivity in the range of 10-14. However, hafnium oxide in a ferroelectric phase may have a relative permittivity exceeding 25 (e.g., 30). Although in both instances the $HfO_x$ comprises predominantly hafnium and oxygen, ferroelectric material 361 is more specifically a ferroelectric phase of the hafnium oxide. Such phases may be achieved, for example, through the addition of a dopant, such as silicon, germanium, aluminum, or yttrium. Although doped ferroelectric $HfO_x$ is an exemplary embodiment that can be advantageously conformally deposited by ALD, ferroelectric material 361 may also have other compositions similarly amenable to being deposited at temperatures compatible with BEOL structures and with similar thickness conformality.

In exemplary embodiments where capacitor conductor 360 is substantially cylindrical (e.g., a right cylinder that is open at the top), ferroelectric material 361 lines at least an interior sidewall of the cylinder. Capacitor conductor 362 is adjacent to the ferroelectric material 361, likewise lining at least an interior sidewall of the cylinder. Following a deposition of capacitor conductor 362, a subtractive etch process may be utilized to pattern capacitor conductor 362 into separated plate lines running parallel to one of wordline 10 or the bitline 6.

Returning to FIG. 2 with a first memory array level fabricated, monolithic embodiments of methods 200 continue by repeating blocks 220 and 230 for each additional memory array level. In the example, illustrated in FIG. 3, the first TFTs 382 and first ferroelectric capacitors 20 comprise memory level 391. A second wordline 10 is fabricated in metallization level Mg, over memory level 391. Likewise, a second level of TFTs 382' and capacitors 20' are fabricated as another memory level 391'.

Returning to FIG. 2 with the second memory array level fabricated, methods 200 continue at block 240 if no additional memory levels are to be monolithically fabricated. At block 240, BEOL interconnect of at least one embedded memory array level to the underlying FET circuitry is completed. For example, as shown in FIG. 3, metallization levels $M_{10}$-$M_{13}$ are fabricated over the one or more memory array levels.

In accordance with some alternative embodiments, an IC structure including one or more memory array levels is directly bonded to a backside of a host IC structure that includes an embedded memory array level. If no bonding is to be performed, methods 200 end at output 290 where a wafer comprising some number of the IC structures fabricated are singulated into individual units for packaging according to any known techniques. If direct bonding is to be performed, methods 200 progress from block 240 to block 250 where a bondable interface is formed on the host IC structure. In exemplary embodiments, the bondable interface comprises metal features embedded in a dielectric material with both the metal features and dielectric material being of compositions known to be suitable for forming a bond through thermal and/or compression bonding techniques. Methods 200 then continue at block 270 where a second IC structure with a bondable memory array level received at input 260 is bonded to the bondable interface on the host IC structure. The bonding may be with any thermal and/or compression bonding technique known to be suitable for such IC structures. As described further below, the bonding may be face-to-back (with a front side of the second IC structure bonded to a back of the host IC structure) or back-to-back (with a back side of the second IC structure bonded to a back of the host IC structure). The bonding can also be face-to-face (with a front side of the second IC structure bonded to a front side of the host IC structure).

Figure 4:
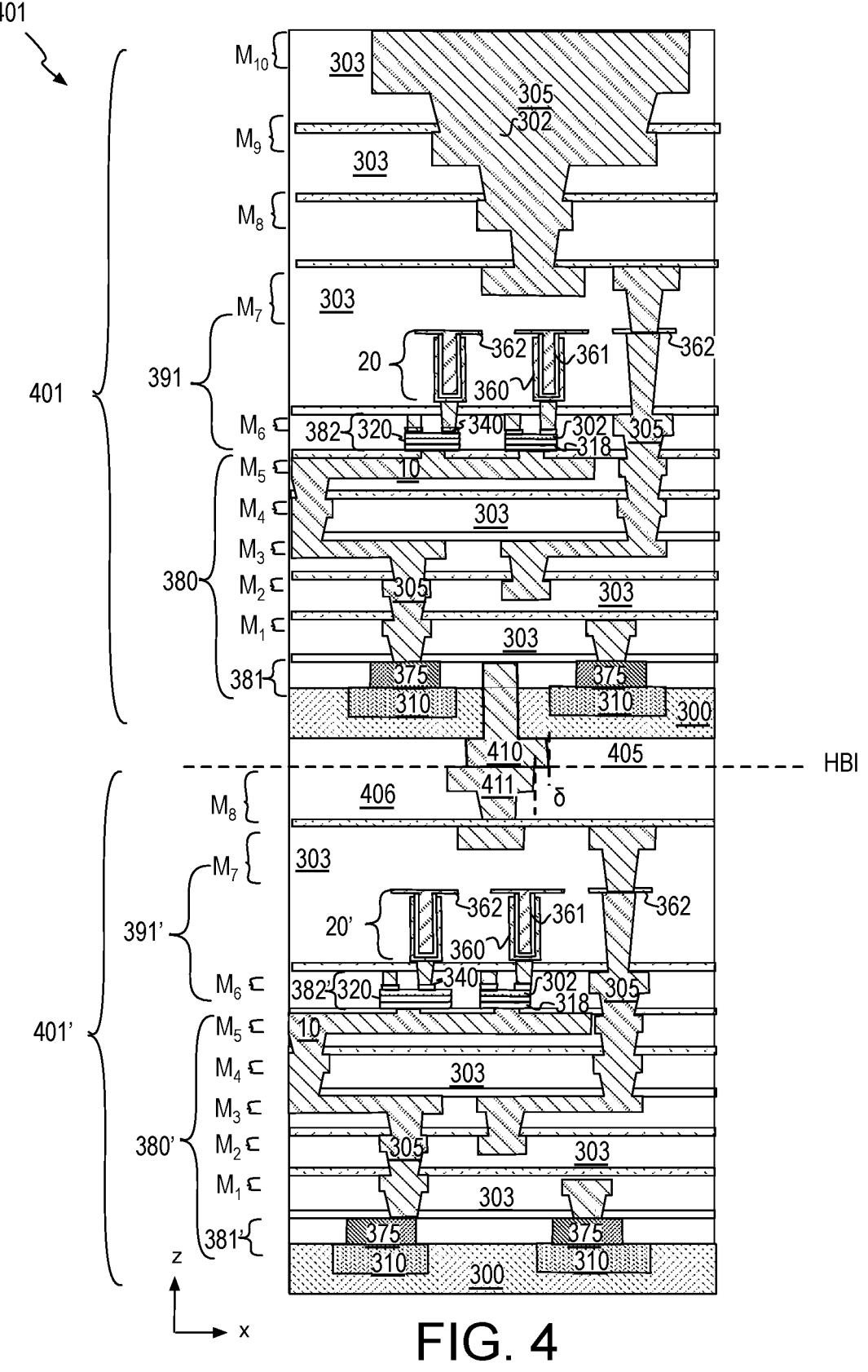
FIG. 4 illustrates a cross-section side view of the IC illustrated in FIG. 1, in accordance with some exemplary hybrid-bonded composite IC embodiments.

FIG. 4 illustrates a cross-sectional side view of an IC structure 401, which is a portion of the IC 100 illustrated in FIG. 1, in accordance with some directly bonded embodiments. In FIG. 4, reference numbers from FIG. 3 are retained for structures that may have any of the same properties described for like structures introduced in IC structure 301. As shown in FIG. 4, structure 401 shares many of the features of IC structure 301, including FEOL circuitry 380, memory array level 391 and BEOL metallization levels $M_8$-$M_{10}$ over memory array level 391. However, memory array level 391' is bonded to a back side of transistors 381 and/or a backside of substrate 300. A hybrid bond interface (HBI) is illustrated in FIG. 4 with a dashed line.

At the HBI, there is a composite interconnect metallization feature comprising both a metallization feature 410 and a metallization feature 411 that are on opposite sides of the HBI and in direct contact with each other. Prior to bonding, backside processing of host IC structure 401 comprises a thinning of substrate 300. A via etch and/or metal deposition is performed after thinning the backside to form metallization feature 410 on the backside of transistors 381 and/or substrate 300.

Upon bonding, metal interdiffusion unifies the metallization features 410 and 411 into a single composite interconnect feature. Dielectric materials 405, 406 surround metallization features 410 and 411, respectively. Dielectric material 405 chemically bonds to dielectric material 406 along the HBI. With both the metal features and the insulators of the two IC die structures fused, the resultant composite IC structure comprises a hybrid bonded interface of both metallurgically interdiffused metals and chemically bonded insulators. As such, each IC die structure may be fabricated with the same or different wafer fab technologies. Notably, although the precision of bonding processes is constantly improving, an alignment misregistration δ between sidewalls of metallization features 410 and 411 will be at least 1-2 orders of magnitude larger than any misregistration between structures monolithically fabricated. Hence, along the HBI all composite structures may display as similar lateral offset associated with the HBI.

FIG. 4 illustrates an exemplary face-to-back embodiment where a face (top side) of IC structure 401' is bonded to a back (bottom side) of host IC structure 401. With this architecture, memory array level 391' has substantially the same orientation as memory array level 391. For example, capacitors 20 are over TFTs 382, and capacitors 20' are similarly over TFTs 382'. IC structure 401' further includes FEOL metallization 380' that again includes another level of monocrystalline channeled transistors 381'. For such embodiments, transistors 381' monolithically interconnected to memory array level 391' (e.g., through metallization levels M₁-M₅) may implement periphery memory circuitry for memory array level 391'. Transistors 381' may therefore implement periphery memory circuitry for only monolithically integrated memory array level 391.

Figure 5:
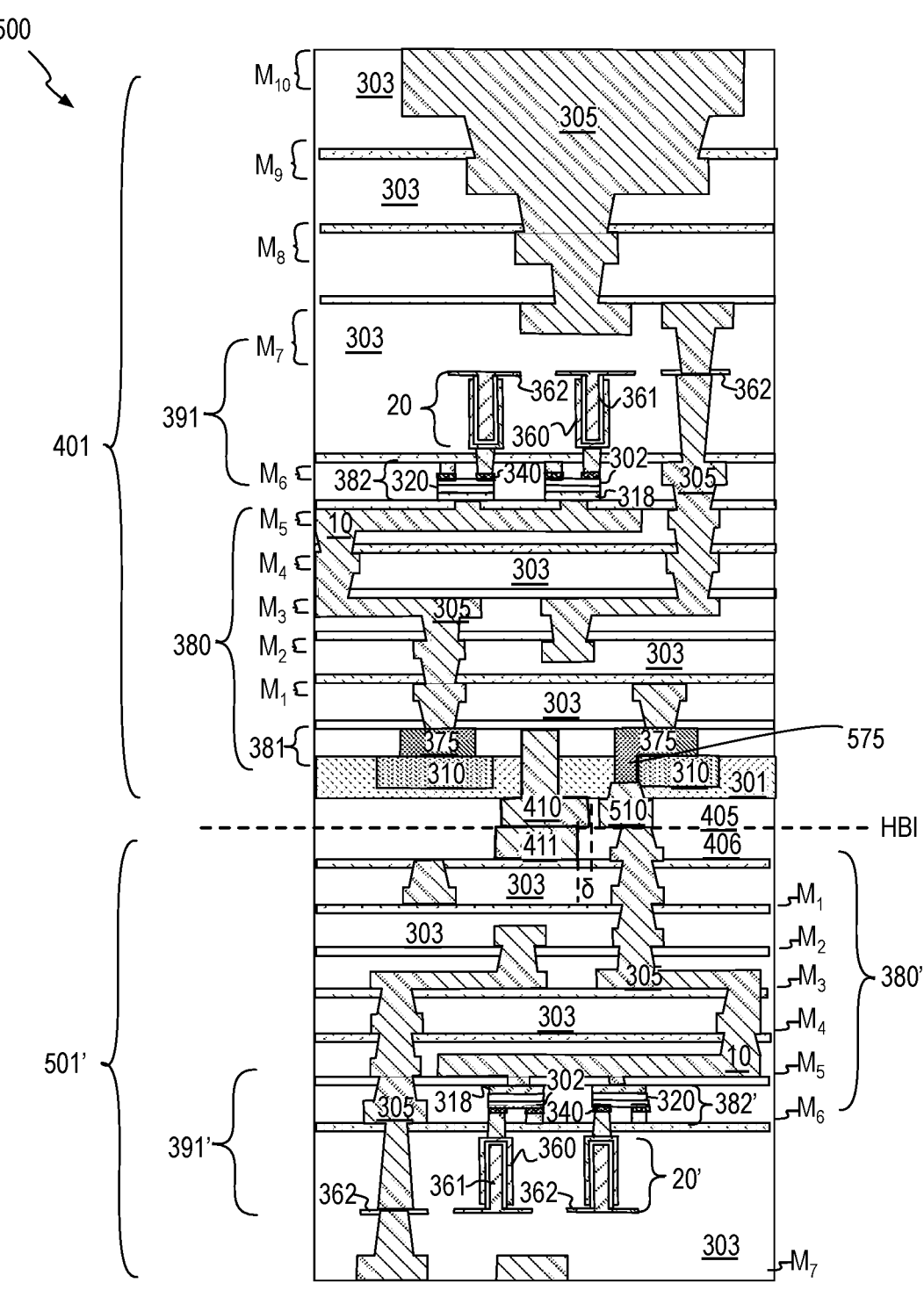
FIG. 5 illustrates a cross-sectional side view of the IC illustrated in FIG. 1, in accordance with some alternative hybrid-bonded composite IC embodiments.

FIG. 5 illustrates an exemplary back-to-back bonding embodiment where a composite IC structure 500 includes a back (bottom side) of IC structure 501' directly bonded to a back (bottom side) of host IC structure 401. As shown, in this architecture capacitors 20' and TFTs 382' of memory array level 391' are inverted relative to capacitors 20 and TFTs 382 of memory array level 391. In composite IC structure 501, host IC structure 401 is substantially as described above, with a monocrystalline channeled transistors 381 interconnected to memory level 391 through metallization levels of FEOL circuitry 380. A composite interconnect feature at the HBI comprises a metallization feature 410 that passes through substrate 300 to couple with metallization feature 411 that is part of FEOL metallization 380' within IC structure 501'.

In the embodiment illustrated in FIG. 5, a source and/or drain terminal 310 of one or more transistors 381 are directly coupled to a metallization feature 510 on the back side of transistors 381, for example through a deep source/drain semiconductor extension 575. Metallization feature 510 is therefore a secondary contact to source/drain terminal 310 and metallization feature 510 is also directly bonded to FEOL metallization 305 within IC structure 501'. Transistors 381 are therefore directly coupled both memory array levels 391 and 391'. In some further embodiments, transistors 381 implement periphery memory circuitry for both memory array levels 391 and 391'. Hence, IC structure 501' does not include a second layer of monocrystalline transistors so that composite IC structure 500 includes a single level of FEOL CMOS circuitry with two memory array levels on opposite sides of the CMOS circuitry.

Figure 6:
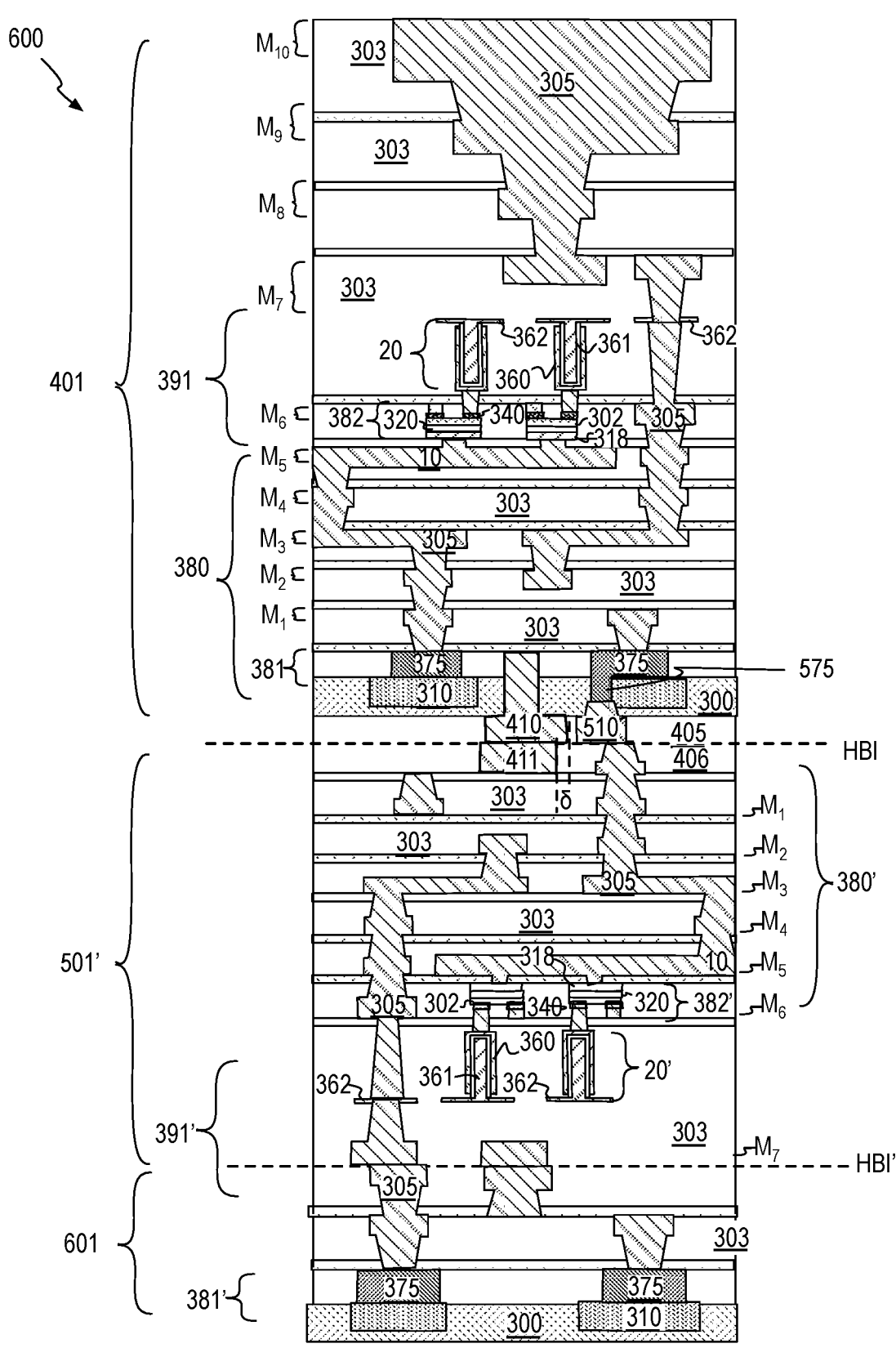
FIG. 6 illustrates a cross-sectional side view of the IC illustrated in FIG. 1, in accordance with some alternative hybrid-bonded composite IC embodiments.

FIG. 6 illustrates another exemplary back-to-back bonding embodiment where a composite IC structure 600 includes a back (bottom side) of IC structure 501' directly bonded to a back (bottom side) of host IC structure 401 substantially as described for composite IC structure 500 in FIG. 5. However, as further illustrated, another hybrid bond interface HBI' is on the front (top) side of IC structure 501' where IC structure 601 is directly bonded to IC structure 501'. In this example, IC structure 601 includes another layer of CMOS transistors 381' with monocrystalline channel material. Transistors 381' may, for example, implement periphery memory circuitry (e.g., row and column decoders, sense amps, etc.) for memory array level 391.

Figure 7:
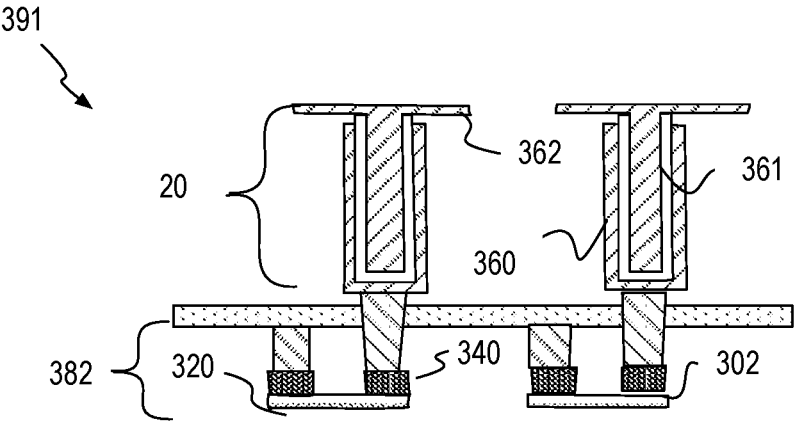
FIG. 7 illustrates a cross-sectional schematic of 1T-F memory array structures that may be implemented in each level of a multi-leveled eDRAM, in accordance with some embodiments.
Figure 8:
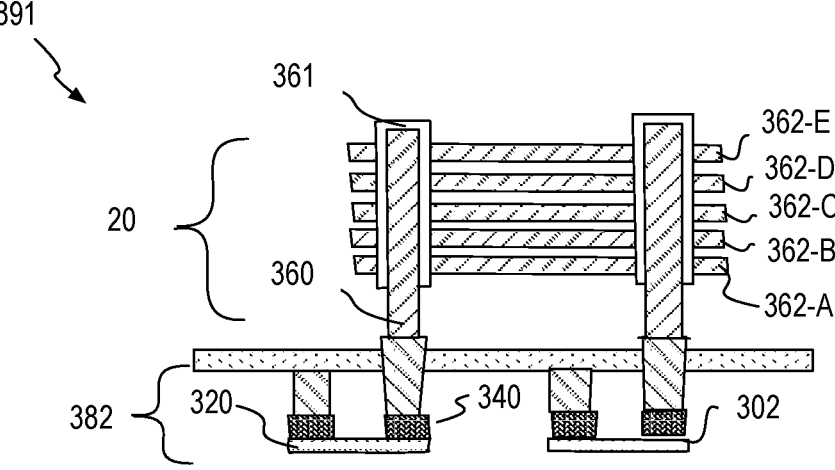
FIG. 8 illustrates a cross-sectional schematic of 1T-nF memory array structures that may be implemented in each level of a multi-leveled eDRAM, in accordance with some alternative embodiments.

Although FIG. 3-5 illustrate exemplary 1T-1F embodiments of embedded memory with multiple memory array levels, similar architectures are also possible with 1T-xF embodiments having two or more ferroelectric capacitors for each access transistor. FIG. 7 illustrates an expanded view of the 1T-1F memory array level 391 illustrated in FIG. 3-5. FIG. 8 illustrates one exemplary 1T-xF memory array level 891 for comparison. In the example of FIG. 8, x is 5 and there are five plate lines 362-A, 362-B, 362-C, 362-D, and 362-E in a vertical stack electrically isolated from each other. The number of plate lines may vary however, from at least two to any integer number larger than two. Each plate line in the stack of plate lines 362-A through 362-E is separated from an inner capacitor conductor 360 that is coupled to access transistors 382. Ferroelectric material 361 is between the plate lines and capacitor conductor 360 so that separate dipole domains within the ferroelectric material

361 may have polarizations written and sensed by an electric field across capacitor conductor 360 and individual ones of plate lines 362-A through 362-E.

Any of the multiple level embedded memory structures described above may therefore be implemented with each, or any, memory array level further comprising either the 1T-1F structures shown in FIG. 7, or the 1T-xF structures shown in FIG. 8. Hence, any of the embodiments illustrated in FIG. 3-6 may be implemented with a 1T-xF architecture in at least one memory array level and potentially all memory array levels.

Figure 9:
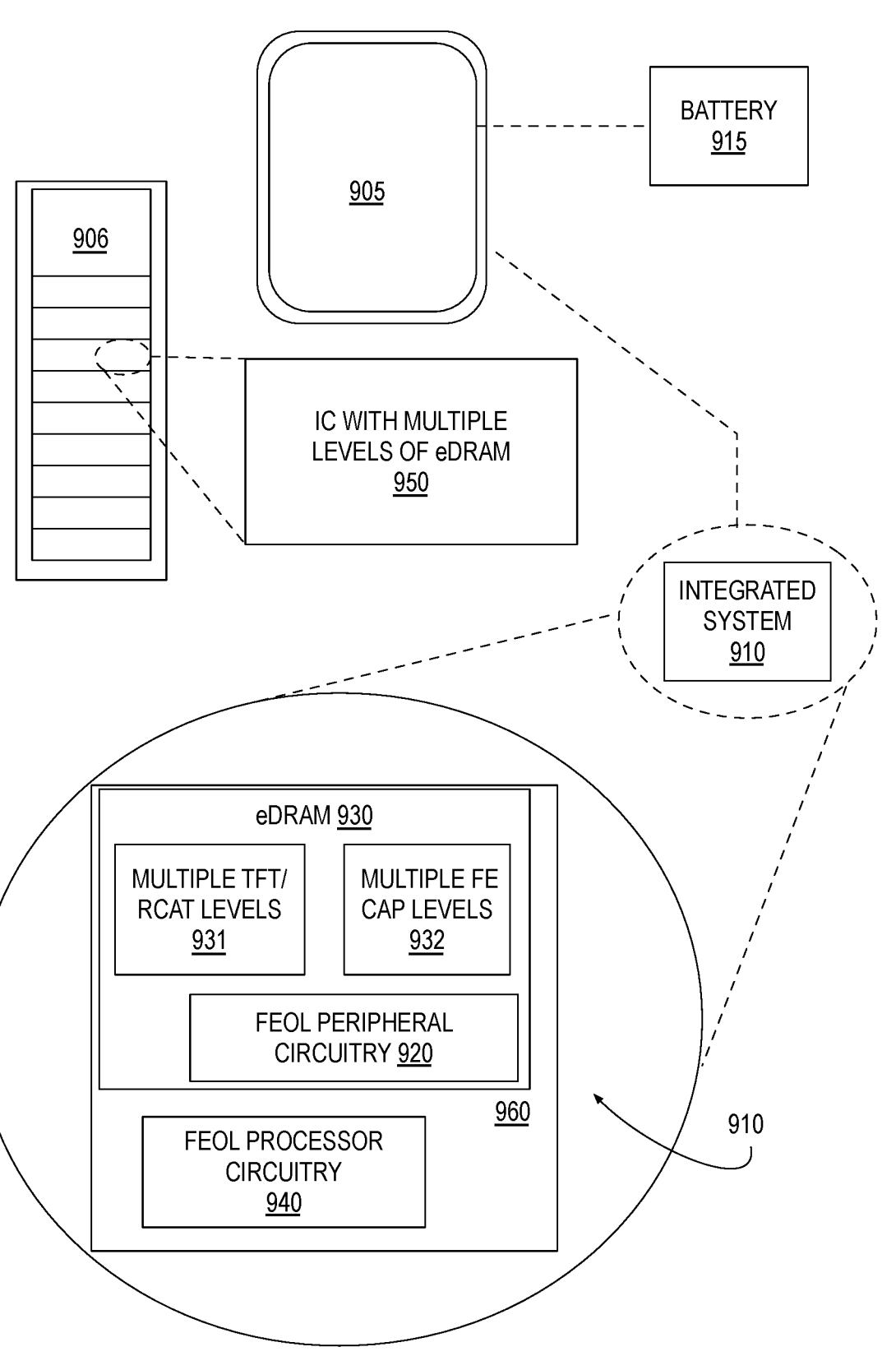
FIG. 9 illustrates a mobile computing platform and a data server machine employing an IC with multiple levels of embedded memory array structures, in accordance with some embodiments.

FIG. 9 illustrates a mobile computing platform 905 and a data server machine 906 employing one or more integrated circuits with embedded memory that includes multiple levels of eDRAM with FE capacitors, for example as described elsewhere herein. Server machine 906 may be any commercial server, for example including any number of high-performance computing platforms disposed within a rack and networked together for electronic data processing, which in the exemplary embodiment includes an IC 960 with multiple levels of eDRAM with FE capacitors, for example as described elsewhere herein. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), an integrated system 910, and a battery 915.

As illustrated in the expanded view 910, an IC 960 includes FEOL processor circuitry 940 and multi-leveled embedded memory 930. Embedded memory 930 further includes FEOL peripheral circuitry 920, multiple levels of TFT/RCAT access transistors 931, and multiple levels of FE capacitors 932, for example as described elsewhere herein.

Figure 10:
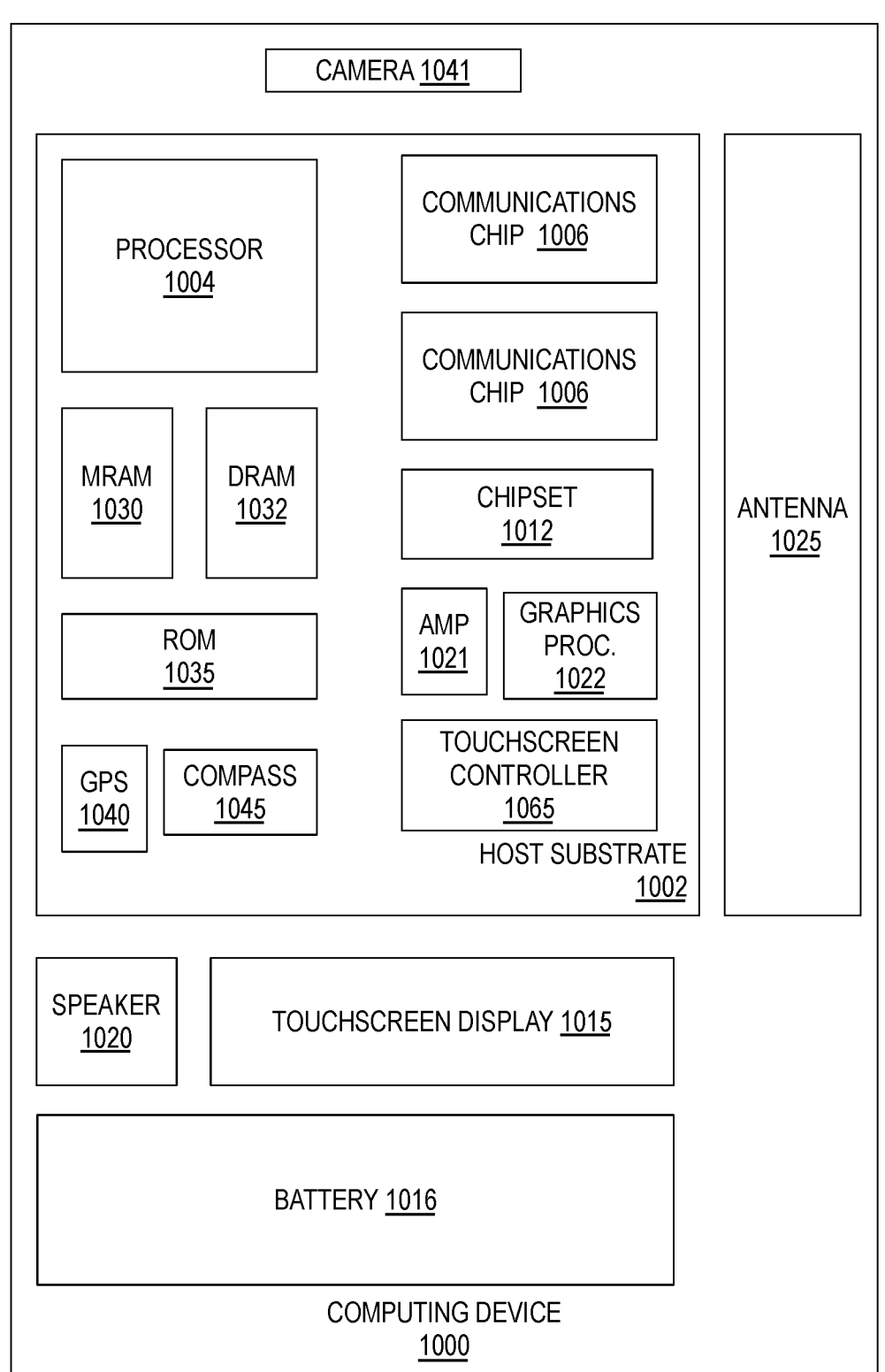
FIG. 10 is a functional block diagram of an electronic computing device, in accordance with some embodiments.

FIG. 10 is a functional block diagram of an electronic computing device 1000, in accordance with an embodiment of the present invention. Computing device 1000 may be found inside either mobile computing platform 905 or server machine 906, for example. Device 1000 further includes a host substrate 1002 hosting a number of components, such as, but not limited to, a processor 1004 (e.g., an applications processor). Processor 1004 may be physically and/or electrically coupled to host substrate 1002. In some examples, processor 1004 comprises one or more integrated circuits that includes multiple levels of eDRAM with FE capacitors, for example as described elsewhere herein. Processor 1004 may be implemented with circuitry in any (or all) of the IC die of the composite IC die package. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to host substrate 1002. In further implementations, communication chips 1006 may be part of processor 1004. Depending on its applications, computing device 1000 may include other components that may or may not be physically and electrically coupled to host substrate 1002. These other components include, but are not limited to, volatile memory (e.g., DRAM 1032), non-volatile memory (e.g., ROM 1035), flash memory (e.g., NAND or NOR), magnetic memory (MRAM 1030), a graphics processor 1022, a digital signal processor, a crypto processor, a chipset 1012, an antenna 1025, touchscreen display 1015, touchscreen controller 1065, battery 1016, audio codec, video codec, power amplifier 1021, global positioning system (GPS) device 1040, compass 1045, accelerometer, gyroscope, speaker 1020, camera 1041, and mass storage device (such as hard disk drive, solid-state drive (SSD), compact disk (CD), digital versatile disk (DVD), and so forth), or the like. In some exemplary embodiments, at least one of the components of device 1000 comprises one or more integrated circuits with BEOL FE capacitors and TFT or RCAT access transistors vertically integrated with FEOL logic circuitry, for example as described elsewhere herein.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) die comprises first transistors with monocrystalline channel material, and an embedded memory array structure coupled to the first transistors. The embedded memory array structure comprises a first level of capacitors and thin film transistors (TFTs) coupled thereto. Each of the capacitors in the first level comprise a first conductor and a second conductor with a ferroelectric material therebetween. The memory array structure further comprises a second level of capacitors and TFTs coupled thereto, in a vertical stack with the first level of capacitors and TFTs. Each of the capacitors in the second level comprise a first conductor and a second conductor with the ferroelectric material therebetween. The IC die further comprises a top metallization level over the embedded memory array structure.

In second examples, for any of the first examples, the IC die comprise one or more first levels of metallization over the first transistors. The first level of capacitors and TFTs is on a front side of the first levels of metallization. The second level of capacitors and TFTs is on a back side of the first transistors.

In third examples, for any of the second examples the IC die comprises a hybrid bond interface (HBI) between a first metal feature on a backside of the first transistors and a second metal feature of one or more second levels of metallization coupled to the second level of capacitors and TFTs.

In fourth examples, for any of the third examples the IC die comprises second transistors having a monocrystalline channel material, the second transistors below the second level of capacitors with one or more third levels of metallization therebetween.

In fifth examples, for any of the fourth examples the first transistors are part of sense amp circuitry for the first level of capacitors and TFTs, and the second transistors are part of sense amp circuitry for the second level of capacitors and TFTs.

In sixth examples, for any of the third examples at least some of the first transistors are coupled to the second level of capacitors and TFTs through the second levels of metallization.

In seventh examples, for any of the sixth examples a first subset of the first transistors are part of sense amp circuitry for the first level of capacitors and TFTs, and a second subset of the first transistors are part of sense amp circuitry for the second level of capacitors and TFTs.

In eighth examples, for any of the third examples the IC die further comprises second transistors having a monocrystalline channel material, the second transistors below the second level of capacitors and second transistors with one or more third levels of metallization therebetween.

In ninth examples, for any of the eighth examples the second transistors are part of decoder circuitry for the second level of capacitors and TFTs.

In tenth examples, for any of the first through ninth examples the first level of capacitors and TFTs comprise an array of 1T-1F bit-cells, and the second level of capacitors and TFTs comprise an array of 1T-1F bit-cells.

In eleventh examples, for any of the tenth examples the first level of capacitors and TFTs comprise an array of 1T-xF bit-cells, where x is an integer number greater than one, and the second level of capacitors and TFTs comprise an array of 1T-xF bit-cells, where x is an integer number greater than one.

In twelfth examples, for any of the first through eleventh examples the ferroelectric material comprises predominantly Hf, O, and one or impurity dopants that comprise at least one of Si or Ge.

In thirteenth examples, a system comprises an integrated circuit (IC) die and a power supply coupled to the IC die to power to the IC die. The IC die comprises a plurality of first transistors with monocrystalline channel material, and an embedded memory array structure coupled to the first transistors. The embedded memory array structure comprises at least two levels of ferroelectric capacitors and thin film transistors. The IC die comprises one or more levels of metallization over the memory array structure.

In fourteenth examples, for any of the thirteenth examples the IC die includes at least one of microprocessor core circuitry or floating point gate array (FPGA) circuitry.

In fifteenth examples, a method of fabricating an integrated circuit (IC) die comprises forming a plurality of first transistors comprising monocrystalline channel material, forming one or more first levels of metallization over the first transistors, and forming a memory array over the first levels of metallization. Forming the memory array comprises forming a first level of ferroelectric capacitors and thin film transistors (TFTs) coupled thereto, and forming, above the first level, or on a backside of the first transistors, a second level of ferroelectric capacitors and TFTs coupled thereto.

In sixteenth examples, for any of the fifteenth examples forming the second level of ferroelectric capacitors and TFTs further comprises hybrid bonding the second level of ferroelectric capacitors and TFTs to a bonding interface on a backside of the first transistors.

In seventeenth examples for any of the sixteenth examples the hybrid bonding comprises bonding the second level of ferroelectric capacitors inverted with respect to the first level of ferroelectric capacitors.

In eighteenth examples, for any of the seventeenth examples the method further comprises hybrid bonding an IC structure comprising second transistors with monocrystalline channel material to a backside of the second level of ferroelectric capacitors and TFTs.

In nineteenth examples, for any of the fifteenth examples forming the second level of ferroelectric capacitors and TFTs further comprises exposing the backside of the first transistors and forming a first metal feature coupled to a terminal of one of the first transistors, and bonding the first metal feature to a second metal feature of one or more metallization levels coupled to the second level of ferroelectric capacitors and TFTs.

In twentieth examples, for any of the fifteenth examples forming the second level of ferroelectric capacitors and TFTs further comprises monolithically fabricating the second level of ferroelectric capacitors and TFTs over the first level of ferroelectric capacitors.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) die, comprising:
   first field effect transistors (FETs) with monocrystalline channel material; and
   an embedded memory array structure coupled to the first FETs, wherein the embedded memory array structure comprises:
   a first array level on a front side of the first FETs, the first array level comprising capacitors and thin film transistors (TFTs) coupled thereto, wherein each of the capacitors in the first array level comprises a first conductor and a second conductor with a ferroelectric material therebetween; and
   a second array level on a back side of the first FETs, the second array level comprising capacitors and TFTs coupled thereto, in a vertical stack with the first array level, and with the first FETs between the first array level and the second array level, wherein each of the capacitors in the second array level comprises a first conductor and a second conductor with the ferroelectric material therebetween.

2. The IC die of claim 1, further comprising one or more first levels of metallization between the first FETs and the first array level.

3. The IC die of claim 2, further comprising a hybrid bond interface (HBI) between a first metal feature on the back side of the first FETs and a second metal feature of one or more second levels of metallization located between the first FETs and the second array level.

4. The IC die of claim 3, further comprising second FETs having a monocrystalline channel material, the second FETs separated from the first FETs by the second array level with one or more third levels of metallization between the second FETs and the second array level.

5. The IC die of claim 4, wherein the first FETs are part of sense amp circuitry for the first level of capacitors and TFTs, and wherein the second FETs are part of sense amp circuitry for the second level of capacitors and TFTs.

6. The IC die of claim 3, wherein at least some of the first FETs are coupled to the second array level through the second levels of metallization.

7. The IC die of claim 6, wherein a first subset of the first FETs are part of sense amp circuitry for the first array level, and a second subset of the first FETs are part of sense amp circuitry for the second array level.

8. The IC die of claim 6, further comprising second FETs having a monocrystalline channel material, the second FETs separated from the first FETs by the second array level with one or more third levels of metallization between the second FETs and the second array level.

9. The IC die of claim 8, wherein the second FETs are part of decoder circuitry for the second level of capacitors and TFTs.

10. The IC die of claim 1, wherein:
   the first array level comprises an array of 1T-1F bit-cells; and
   the second array level comprises an array of 1T-1F bit-cells.

11. The IC die of claim 10, wherein:
   the first array level comprises an array of 1T-xF bit-cells, where x is an integer number greater than one; and
   the second array level comprises an array of 1T-xF bit-cells, where x is an integer number greater than one.

12. The IC die of claim 1, wherein:
   the ferroelectric material comprises predominantly Hf, O, and one or impurity dopants that comprise at least one of Si or Ge.

13. A system comprising:
   the IC die of claim 1; and
   a power supply coupled to the IC die to power the IC die.

14. The system of claim 13, wherein:
   the IC die includes at least one of microprocessor core circuitry or floating point gate array (FPGA) circuitry.

* * * * *